(12) United States Patent
Doyle

(10) Patent No.: US 8,405,394 B2
(45) Date of Patent: Mar. 26, 2013

(54) TARGETED ACQUISITION USING HOLISTIC ORDERING (TACHO) APPROACH FOR HIGH SIGNAL TO NOISE IMAGING

(75) Inventor: Mark Doyle, Wexford, PA (US)

(73) Assignee: Allegheny-Singer Research Institute, Pittsburgh, PA (US)

( * ) Notice: Subject to any disclaimer, the term of this patent is extended or adjusted under 35 U.S.C. 154(b) by 616 days.

(21) Appl. No.: 12/589,191

(22) Filed: Oct. 20, 2009

(65) Prior Publication Data

US 2011/0089945 A1 Apr. 21, 2011

(51) Int. Cl.
*G01V 3/00* (2006.01)

(52) U.S. Cl. .................................. 324/309; 324/312

(58) Field of Classification Search .................. 324/309, 324/312, 314
See application file for complete search history.

(56) References Cited

U.S. PATENT DOCUMENTS

| | | |
|---|---|---|
| 4,310,799 A | 1/1982 | Hutchison et al. |
| 4,727,327 A | 2/1988 | Toyoshima et al. |
| 4,829,252 A | 5/1989 | Kaufman |
| 4,973,906 A | 11/1990 | Bernstein |
| 5,034,692 A | 7/1991 | Laub et al. |
| 5,160,889 A | 11/1992 | Scheidegger et al. |
| 5,204,627 A | 4/1993 | Mistretta et al. |
| 5,305,749 A | 4/1994 | Li et al. |
| 5,417,213 A | 5/1995 | Prince |

(Continued)

FOREIGN PATENT DOCUMENTS

| | | |
|---|---|---|
| EP | 0430104 A2 | 6/1991 |
| EP | 0924530 A2 | 6/1999 |

(Continued)

OTHER PUBLICATIONS

Doyle et al. "Block Regional Interpolation Scheme for K-Space (BRISK): A Rapid Cardiac Imaging Technique" 1995, Magnetic Resonance in Medicine, Academic Press (Duluth, MN, US) 33:163-170.

(Continued)

*Primary Examiner* — Louis Arana
(74) *Attorney, Agent, or Firm* — Fox Rothschild LLP

(57) ABSTRACT

An MRI includes imaging coils. The MRI includes receiving coils. The MRI includes a controller in communication with the imaging coils and the receiving coils which controls the imaging coils and the receiving coils to sample k space associated with a patient in a pattern based on prior knowledge of k space data, and which reconstructs an image of the patient from the sampled k space. A method of an MRI includes the steps of acquiring preliminary k space data of a patient indicating the extent of k space data for all receiver channels using imaging and receiving coils. There is the step of determining with a controller which regions of signal associated with the k space are to be targeted by multiple acquisition blades of data with the imaging and receiver coils based on the preliminary k space. There is the step of sampling each of the regions determined by the controller with the blades to obtain k space data. There is the step of storing the k space data in a memory. There is the step of interpolating the k space data to fit in a regular rectangular grid and fitting each separate blade of k space data to the grid with the controller. There is the step of averaging overlapping k space data with the controller. There is the step of reconstructing an image from the k space data. A computer program.

18 Claims, 8 Drawing Sheets

U.S. PATENT DOCUMENTS

| | | | |
|---|---|---|---|
| 5,525,904 | A | 6/1996 | Hanley et al. |
| 5,668,474 | A | 9/1997 | Heid |
| 5,713,358 | A | 2/1998 | Mistretta et al. |
| 5,910,728 | A | 6/1999 | Sodickson |
| 6,018,600 | A | 1/2000 | Levin et al. |
| 6,088,611 | A | 7/2000 | Lauterbur et al. |
| 6,233,475 | B1 | 5/2001 | Kim et al. |
| 6,239,598 | B1 * | 5/2001 | Zhang ............................ 324/309 |
| 6,259,940 | B1 | 7/2001 | Bernstein et al. |
| 6,275,037 | B1 | 8/2001 | Harvey et al. |
| 6,307,368 | B1 | 10/2001 | Vasanawala et al. |
| 6,310,478 | B1 | 10/2001 | Heid |
| 6,487,435 | B2 | 11/2002 | Mistretta et al. |
| 6,567,685 | B2 | 5/2003 | Takamori et al. |
| 6,630,828 | B1 | 10/2003 | Mistretta et al. |
| 6,724,923 | B2 * | 4/2004 | Ma et al. ....................... 382/131 |
| 6,771,067 | B2 | 8/2004 | Kellman et al. |
| 6,794,867 | B1 | 9/2004 | Block et al. |
| 6,975,115 | B1 | 12/2005 | Fujita et al. |
| 7,005,853 | B2 | 2/2006 | Tsao et al. |
| 7,020,509 | B2 | 3/2006 | Heid |
| 7,023,207 | B1 | 4/2006 | Gaddipati et al. |
| 7,078,899 | B2 * | 7/2006 | Dale et al. ..................... 324/314 |
| 7,202,663 | B2 | 4/2007 | Huang |
| 7,245,125 | B2 | 7/2007 | Harer et al. |
| 7,253,620 | B1 | 8/2007 | Derbyshire et al. |
| 7,285,954 | B2 * | 10/2007 | Nezafat et al. ................ 324/309 |
| 7,394,252 | B1 | 7/2008 | Lin |
| 7,486,074 | B2 | 2/2009 | McKenzie et al. |
| 7,541,808 | B2 | 6/2009 | Doyle |
| 7,592,808 | B1 | 9/2009 | King |
| 7,683,614 | B2 | 3/2010 | Posse |
| 7,693,563 | B2 | 4/2010 | Suresh et al. |
| 2003/0166999 | A1 | 9/2003 | Liu et al. |
| 2003/0169043 | A1 | 9/2003 | Hoshino |
| 2004/0051529 | A1 | 3/2004 | Zhu et al. |
| 2004/0254447 | A1 | 12/2004 | Block et al. |
| 2005/0007112 | A1 | 1/2005 | Deimling |
| 2005/0251023 | A1 | 11/2005 | Kannengiesser et al. |
| 2006/0036154 | A1 | 2/2006 | Deimling |
| 2006/0050981 | A1 | 3/2006 | Huang |
| 2007/0063701 | A1 | 3/2007 | Vu |
| 2007/0110290 | A1 | 5/2007 | Chang et al. |
| 2007/0159174 | A1 | 7/2007 | Oshio |
| 2007/0242866 | A1 | 10/2007 | Schmitt et al. |
| 2008/0021304 | A1 | 1/2008 | Stemmer |
| 2008/0175458 | A1 | 7/2008 | Guo et al. |
| 2008/0315879 | A1 | 12/2008 | Saha |
| 2009/0105582 | A1 | 4/2009 | Dougherty et al. |
| 2009/0169083 | A1 | 7/2009 | Li |
| 2009/0179643 | A1 | 7/2009 | Lin |
| 2010/0039110 | A1 * | 2/2010 | Takahashi et al. ............ 324/310 |
| 2011/0241680 | A1 * | 10/2011 | Mossnang et al. ............ 324/309 |

FOREIGN PATENT DOCUMENTS

| | | |
|---|---|---|
| GB | 2034123 A | 5/1980 |
| JP | 06 237910 A | 8/1994 |
| WO | WO 90/02344 | 3/1990 |
| WO | WO 90/12329 | 10/1990 |
| WO | WO 91/13367 A1 | 9/1991 |
| WO | WO 94/29741 A1 | 12/1994 |
| WO | WO 2006/120583 A | 11/2006 |

OTHER PUBLICATIONS

Geier et al. "Parallel Acquisition for Effective Density Weighted Imaging: PLANED Imaging" 2007, Magnetic Resonance Materials in Physics, Biology and Medicine, Chapman and Hall (London, GB) 20(1):19-25).

Kozerke et al. "Accelerating Cardiac Cine 3D Imaging Using k-t BLAST" 2004, Magnetic Resonance in Medicine, Wiley-Liss, Inc. 52:19-26.

Lethmate et al. "Dynamic MR-Imaging with Radial Scanning, a Post-Acquisition Keyhole Approach" 2003, EURASIP J. on app. Signal Processing, Hindawi Publishing Corp. p. 405-412.

Pipe "Reconstructing MR Images From Undersampled Data: Data-Weighting Considerations" 2000, Magnetic Resonance in Medicine, Academic Press (Duluth, MN, US) 43(6):867-875.

Rehwald et al. "Theory of High-Speed MR Imaging o the Human Heart with the Selective Line Acquisition Mode" 2001, Radiology 220(2):540-547.

Tsai et al. "Reduced Aliasing Artifacts using Variable-Density k-Space Sampling Trajectories" 2000, Magnetic Resonance in Medicine, Academic Press (Duluth, MN, US) 43(3):452-458.

Tsao et al. "Eight-fold acceleration in real-time cardiac imaging using k-t BLAST and k-t SENSE with SSFP and segmented EPI" 2003, Proc. Intl. soc. Mag. Reson. Med. 11:209.

Tsao et al. "k-t BLAST and k-t SENSE: Dynamic MRI With High Frame Rate Exploiting Spatiotemporal Correlations" 2003, Magnetic Resonance in Medicine, Wiley-Liss, Inc. 50(5):1031-1042.

Goldfarb "Targeted Rotational Magnetic Resonance Angiography (TROTA): 2D Projection Imaging with 3D Reconstruction" 2004, Proceedings of the International Society for Magnetic Resonance in Medicine, 12th Scientific Meeting and Exhibition (Kyoto, JP) 11:2109.

Gurr et al. "Polar Phase Encode Placement for 3D Acquisition with time-resolved projections" 2003, Proceedings of the International Society for Magnetic Resonance in Medicine, 11th Scientific Meeting and Exhibition (Toronto, Canada 11:1349.

Lin et al. "Blood Attenuation with SSFP-Compatible Saturation (BASS)" 2006, Journal of Magnetic Resonance Imaging, Society for Magnetic Resonance Imaging (Oak Brook, IL, US) 24:701-707.

Uribe et al. "Integration of Magnetization Preparation Sequences into SSFP Sequences: A Fat Saturation Example" 2008, Proceedings of the International Society for Magnetic Resonance in Medicine, 16th Scientific Meeting and Exhibition (Toronto, Canada) p. 1402.

Werner et al. "Continuous Artery-Selective Spin Labeling (CASSL)" 2005, Magnetic Resonance in Medicine, Academic Press (Duluth, MN, US) 53:1006-1012.

Herzka et al. "Myocardial tagging with SSFP" 2003, Magnetic Resonance in Medicine, Academic Press (Duluth, MN, US) 49:329-340 (XP002548177).

Herzka et al. "Multishot EPI-SSFP in the Heart" 2002, Magnetic Resonance in Medicine, Academic Press (Duluth, MN, US) 47(4):655-664 (XP002526274).

Pai "PTAGs: Partial k-space tagging combined with SSFP" 2006, Proceedings of the Int'l Society for Magnetic Resonance in Medicine, 14th Scientific Meeting and Exhibition (Seattle, WA, US) p. 1216 (XP002548176).

Stainsby et al. "Visualizing flow using MR tagging and FIESTA Imaging" 2005, Proceedings of the Int'l Society for Magnetic Resonance in Medicine, 13th Scientific Meeting and Exhibition (Miami Beach, FL, US) p. 2382 (XP002548178).

Witschey et al. "Balanced steady-state free precession spatial gridding" 2008, Proceedings of the Int'l Society for Magnetic Resonance in Medicine, 16th Scientific and Exhibition (Toronto, Canada) p. 1404 (XP002548175).

Griswold et al. "Autocalibrated coil sensitivity estimation for parallel imaging" 2006, NMR in Biomedicine, Wiley (London, GB) 19:316-324.

Kellman et al. "Adaptive Sensitivity Encoding Incorporating Temporal Filtering (TSENSE)" 2001, Magnetic Resonance in Medicine, Academic Press (Duluth, MN, US) 45(5):846-852.

Madore et al. "Unaliasing by Fourier-Encoding the Overlaps Using the Temporal Dimension (UNFOLD), Applied to Cardiac Imaging and fMRI" Magnetic Resonance in Medicine, Academic Press (Duluth, MN, US) 42:813-828.

Song et al. "Dynamic MRI with projection reconstruction and KWIC processing for simultaneous high spatial and temporal resolution" 2004, Magnetic Resonance in Medicine, Academic Press (Duluth, MN, US) 52(4):815-824.

Maier et al. "Accurate Velocity Mapping with FAcE" 1996, Magnetic Resonance Imaging, Elsevier Science, Inc. (USA) 14(2):163-171.

* cited by examiner

TARGETED ACQUISITION USING HOLISTIC ORDERING (TACHO) APPROACH FOR HIGH SIGNAL TO NOISE IMAGING

FIELD OF THE INVENTION

The present invention is related to an MRI that uses prior knowledge of k space data to control the sampling of k space of a patient. (As used herein, references to the "present invention" or "invention" relate to exemplary embodiments and not necessarily to every embodiment encompassed by the appended claims.) More specifically, the present invention is related to an MRI that uses prior knowledge of k space data to control the sampling of k space of a patient wherein a controller causes imaging and receiving coils to form multiple channels of signal acquisition and the controller adjusts acquisition blades defined by the imaging and receiving coils to acquire desired signal from each of the channels based on the prior knowledge.

BACKGROUND OF THE INVENTION

This section is intended to introduce the reader to various aspects of the art that may be related to various aspects of the present invention. The following discussion is intended to provide information to facilitate a better understanding of the present invention. Accordingly, it should be understood that statements in the following discussion are to be read in this light, and not as admissions of prior art.

The present invention describes an acquisition strategy that is applicable to magnetic resonance imaging (MRI) to acquire multiple sections of an image data set and combine them to increase the signal to noise (SNR) compared to a comparable single acquisition of the data. The MRI signal space is termed k-space, and conventional rectilinear scanning methods acquire k-space data such that each image k-space data point is sampled only once, and all regions are sampled with uniform density. Conversely, radial/projective approaches to sampling k-space obtain data as a series of lines that traverse the center of k-space, effectively obtaining a higher density of sampled points near the center of k-space, FIG. 1. FIG. 1 shows the trajectory of sample lines of k-space are indicated for projective/radial sampling schemes. In these schemes, all lines pass through the center of k-space, leading to the highest sampling density near the center and progressively lower sampling density towards the periphery of k-space.

Recently, an approach termed Periodically Rotated Overlapping Parallel Lines with Enhanced Reconstruction (PROPELLER) has been described based on sets of multiple parallel lines or "blades", with each set of parallel lines directed parallel to a radial or diagonal line of k-space, FIG. 2. FIG. 2 shows the approach of acquiring multiple parallel lines to describe a rectangular region of k-space (blade) has previously been described for the PROPELLER imaging approach. The rectangle encompassing the individual lines indicates the region of k-space sampled in this case. "Periodically Rotated Overlapping ParallEL Lines with Enhanced Reconstruction (PROPELLER) MRI: Application to Motion Correction," Pipe, Proc. Intl. Magn. Reson. Med. 7 (1999), p. 242, incorporated by reference herein.

To acquire complete k-space coverage in the PROPELLER approach, multiple sets of these rectangular sampled blades are applied to k-space such that blades are progressively rotated about the center to completely cover k-space with at least a minimum density equivalent to the sampling density of each blade, FIG. 3. FIG. 3 shows the manner in which blades of the PROPELLER imaging approach are applied to sample k-space is illustrated. Each set of rectangular sampled regions (blades) are progressively rotated about the center of k-space until some pre-defined uniform coverage sampling density is achieved. Typically this approach requires scanning more lines of k-space than are required for rectilinear scanning approaches, leading to long scan times. The primary benefit of the multiple sets of parallel lines being that the central region of k-space is repetitively sampled, allowing motion compensation approaches to be applied to each k-space blade.

BRIEF SUMMARY OF THE INVENTION

The present invention pertains to an MRI. The MRI comprises imaging coils. The MRI comprises receiving coils. The MRI comprises a controller in communication with the imaging coils and the receiving coils which controls the imaging coils and the receiving coils to sample k space associated with a patient in a pattern based on prior knowledge of k space data, and which reconstructs an image of the patient from the sampled k space.

The present invention pertains to a method of an MRI. The method comprises the steps of acquiring preliminary k space data of a patient indicating the extent of k space data for all receiver channels using imaging and receiving coils. There is the step of determining with a controller which regions of signal associated with the k space are to be targeted by multiple acquisition blades of data with the imaging and receiver coils based on the preliminary k space. There is the step of sampling each of the regions determined by the controller with the blades to obtain k space data. There is the step of storing the k space data in a memory. There is the step of interpolating the k space data to fit in a regular rectangular grid and fitting each separate blade of k space data to the grid with the controller. There is the step of averaging overlapping k space data with the controller. There is the step of reconstructing an image from the k space data.

The present invention pertains to a method of an MRI. The method comprises the steps of acquiring preliminary k space data of a beating heart of a patient indicating the extent of k space data for all receiver channels using imaging and receiving coils. There is the step of determining with a controller which regions of signal associated with the k space are to be targeted by multiple acquisition blades of data with the imaging and receiver coils based on the preliminary k space. There is the step of sampling each of the regions determined by the controller with the blades to obtain k space data. There is the step of storing the k space data in a memory. There is the step of interpolating the k space data to fit in a regular rectangular grid and fitting each separate blade of k space data to the grid with the controller. There is the step of averaging overlapping k space data with the controller. There is the step of reconstructing an image from the k space data.

The present invention pertains to an MRI. The MRI comprises means for acquiring signals from a patient. The MRI comprises means for controlling the acquiring means in communication with the acquiring means which controls the acquiring means to sample k space associated with the patient in a pattern based on prior knowledge of k space data, and which reconstructs an image of the patient from the sampled k space.

The present invention pertains to a computer program stored on a computer readable medium for an MRI. The program comprises the computer generated steps of acquiring preliminary k space data of a patient indicating the extent of k space data for all receiver channels using imaging and receiving coils. There is the step of determining with a controller which regions of signal associated with the k space are to be targeted by multiple acquisition blades of data with the imaging and receiver coils based on the preliminary k space. There is the step of sampling each of the regions determined by the controller with the blades to obtain k space data. There is the step of storing the k space data in a memory. There is the step of interpolating the k space data to fit in a regular rectangular grid and fitting each separate blade of k space data to the grid with the controller. There is the step of averaging overlapping k space data with the controller. There is the step of reconstructing an image from the k space data.

BRIEF DESCRIPTION OF THE SEVERAL VIEWS OF THE DRAWING

In the accompanying drawings, the preferred embodiment of the invention and preferred methods of practicing the invention are illustrated in which:

FIG. 8b shows the corresponding frame simulating the TACHO acquisition as shown in FIG. 8a.

DETAILED DESCRIPTION OF THE INVENTION

Figure 10:
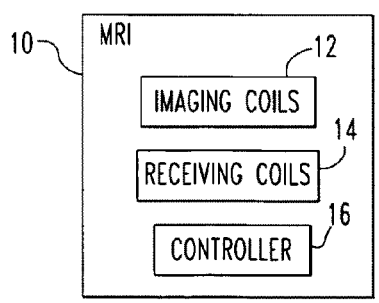
FIG. 10 is a block diagram of an MRI of the present invention.

Referring now to the drawings wherein like reference numerals refer to similar or identical parts throughout the several views, and more specifically to FIG. 10 thereof, there is shown an MRI 10. The MRI 10 comprises imaging coils 12. The MRI 10 comprises receiving coils 14. The MRI 10 comprises a controller 16 in communication with the imaging coils 12 and the receiving coils 14 which controls the imaging coils 12 and the receiving coils 14 to sample k space associated with a patient in a pattern based on prior knowledge of k space data, and which reconstructs an image of the patient from the sampled k space.

The controller 16 may cause the coils to sample only a portion of k space based on the prior knowledge. The controller 16 may use the prior knowledge to obtain desired portions of the k space. The controller 16 may cause the imaging and receiving coils 14 to form multiple channels of signal acquisition and the controller 16 adjusts acquisition blades defined by the imaging and receiving coils 14 to acquire desired signal from each of the channels based on the prior knowledge.

The acquisition blades may overlap. The acquisition blades may overlap to different degrees. Data from separate blades may be acquired such that density requirements of k space are satisfied for each blade separately. The blades may overlap near a center region of k space to improve a signal-to-noise ratio of the center region as compared to a single acquisition scan of the center region. The sample data within each blade may be limited.

Phase encoding by the imaging coils 12 may only be sufficient to span no greater than a width of each blade. Gradients may be applied by the imaging coils 12 which do not exceed a maximum predetermined slew rate. Each k space line may be acquired at a sampling rate such that no signal aliasing occurs. Prior knowledge of k space may be obtained from discarded k space data.

The present invention pertains to a method of an MRI 10. The method comprises the steps of acquiring preliminary k space data of a patient indicating the extent of k space data for all receiver channels using imaging and receiving coils 14. There is the step of determining with a controller 16 which regions of signal associated with the k space are to be targeted by multiple acquisition blades of data with the imaging and receiver coils based on the preliminary k space. There is the step of sampling each of the regions determined by the controller 16 with the blades to obtain k space data. There is the step of storing the k space data in a memory. There is the step of interpolating the k space data to fit in a regular rectangular grid and fitting each separate blade of k space data to the grid with the controller 16. There is the step of averaging overlapping k space data with the controller 16. There is the step of reconstructing an image from the k space data. This can be done by using Fourier transformation or other suitable processing on the acquired k space data as is well known in the art. If desired, additional noise reduction processing can be applied, as is well known in the art.

There can be the step of applying post acquisition data processing to further enhance a signal to noise ratio of the k-space data, making use of the higher signal to noise of the overlapping k space data. There can be the step of the controller 16 causing the coils to sample only a portion of k space based on the prior knowledge. There can be the step of the controller 16 using the prior knowledge to obtain desired portions of the k space. There can be the step of the controller 16 causing the imaging and receiving coils 14 to form multiple channels of signal acquisition and adjusting acquisition blades defined by the imaging and receiving coils 14 to acquire desired signal from each of the channels based on the prior knowledge.

The present invention pertains to a method of an MRI 10. The method comprises the steps of acquiring preliminary k space data of a beating heart of a patient indicating the extent of k space data for all receiver channels using imaging and receiving coils 14. There is the step of determining with a controller 16 which regions of signal associated with the k space are to be targeted by multiple acquisition blades of data with the imaging and receiver coils based on the preliminary k space. There is the step of sampling each of the regions determined by the controller 16 with the blades to obtain k space data. There is the step of storing the k space data in a memory. There is the step of interpolating the k space data to fit in a regular rectangular grid and fitting each separate blade of k space data to the grid with the controller 16. There is the step of averaging overlapping k space data with the controller 16. There is the step of reconstructing an image from the k space data.

The present invention pertains to an MRI 10. The MRI 10 comprises means for acquiring signals from a patient. The MRI 10 comprises means for controlling the acquiring means in communication with the acquiring means which controls the acquiring means to sample k space associated with the patient in a pattern based on prior knowledge of k space data, and which reconstructs an image of the patient from the sampled k space.

The means for acquiring signals from a patient can include imaging coils 12 and receiving coils 14. The controlling means can include the controller 16.

The present invention pertains to a computer program stored on a computer readable medium for an MRI. The program comprises the computer generated steps of acquiring preliminary k space data of a patient indicating the extent of k space data for all receiver channels using imaging and receiving coils. There is the step of determining with a controller which regions of signal associated with the k space are to be targeted by multiple acquisition blades of data with the imaging and receiver coils based on the preliminary k space. There is the step of sampling each of the regions determined by the controller with the blades to obtain k space data. There is the step of storing the k space data in a memory. There is the step of interpolating the k space data to fit in a regular rectangular grid and fitting each separate blade of k space data to the grid with the controller. There is the step of averaging overlapping k space data with the controller. There is the step of reconstructing an image from the k space data.

The present invention employs multiple blades in the manner of PROPELLER to sample k-space but the aim is to only accomplish partial coverage of k-space in a pattern based on prior knowledge of the extent of k-space data. There are multiple means of acquiring this prior knowledge that can be efficiently incorporated into the MRI 10 examination. One such approach is to use k-space data that would normally be discarded in establishing a steady state signal. In this example, the signal is not generally of sufficient quality to form an image, but is quite adequate to guide the subsequent acquisition. Based on the prior knowledge of the k-space distribution, several sets of blades can be acquired so as to capture the most relevant portions of k-space. For example, consider five blades of parallel lines to be acquired, each blade consisting of 50 lines of k-space. In this case, the total number of lines contributing to the final image is 250, which is typical for a conventional rectilinear imaging sequence of the cardiovascular system. In the TACHO case, the prior signal distribution information is used to plan the position of each of the blades to capture some major component of the k-space data in each blade, FIG. 4. In this respect TACHO is holistic in that the whole of the prior data is used to determine which parts to target in the subsequent acquisition.

Figure 1:
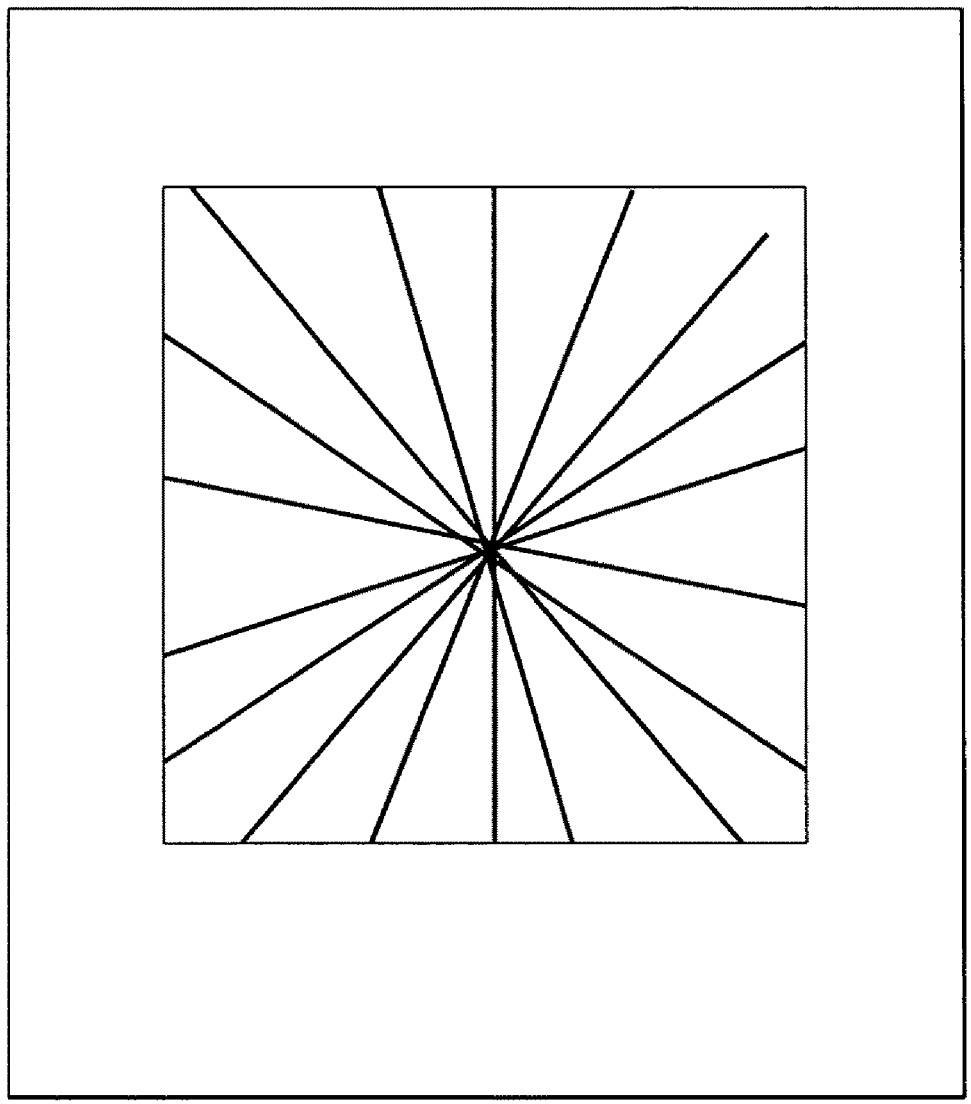
FIG. 1 shows the trajectory of sample lines of k-space are indicated for projective/radial sampling schemes.
Figure 2:
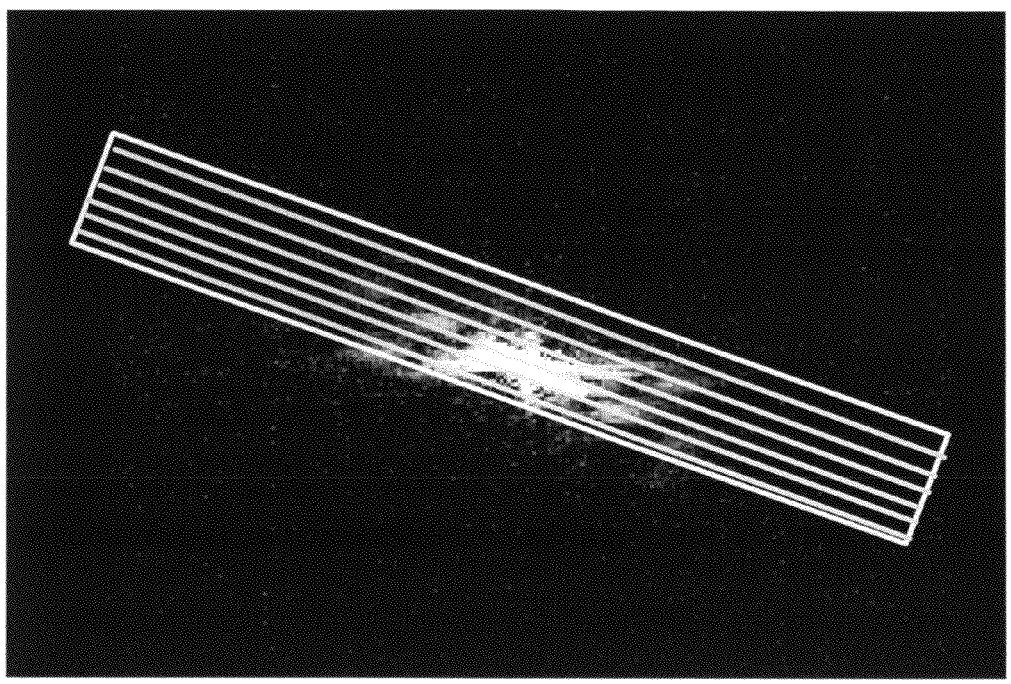
FIG. 2 shows the approach of acquiring multiple parallel lines to describe a rectangular region of k-space (blade) has previously been described for the PROPELLER imaging approach.
Figure 3:
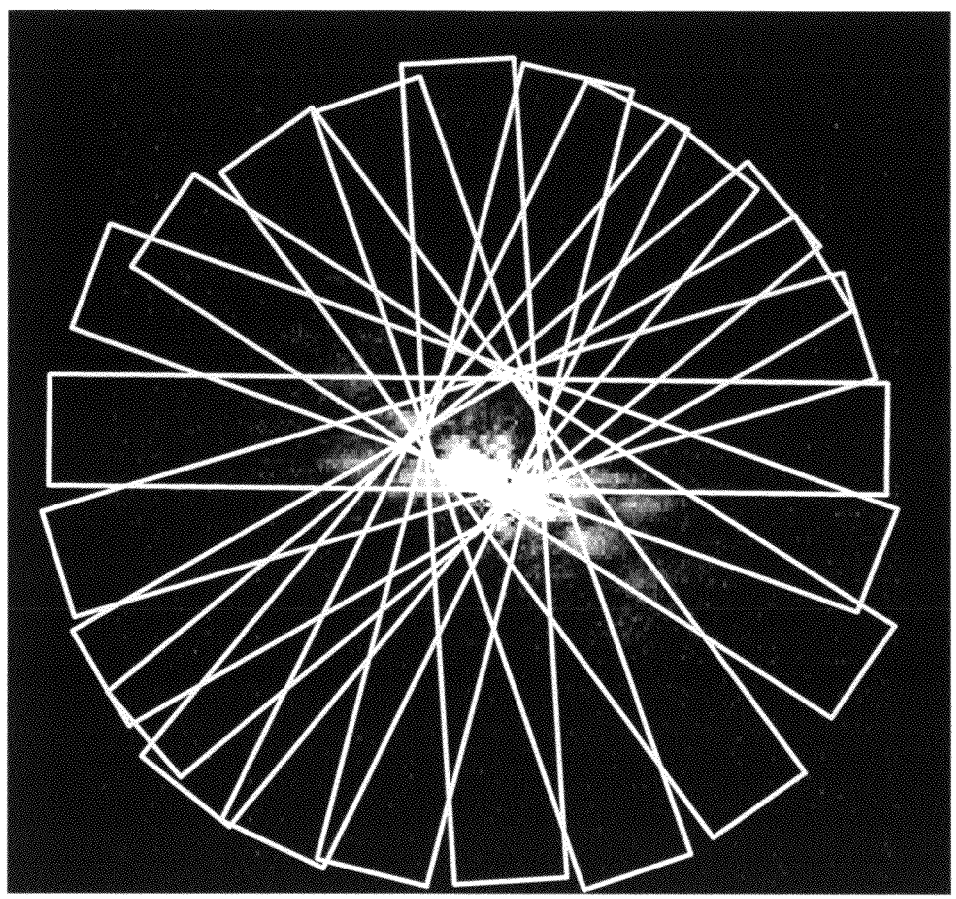
FIG. 3 shows the manner in which blades of the PROPELLER imaging approach are applied to sample k-space is illustrated.
Figure 4:
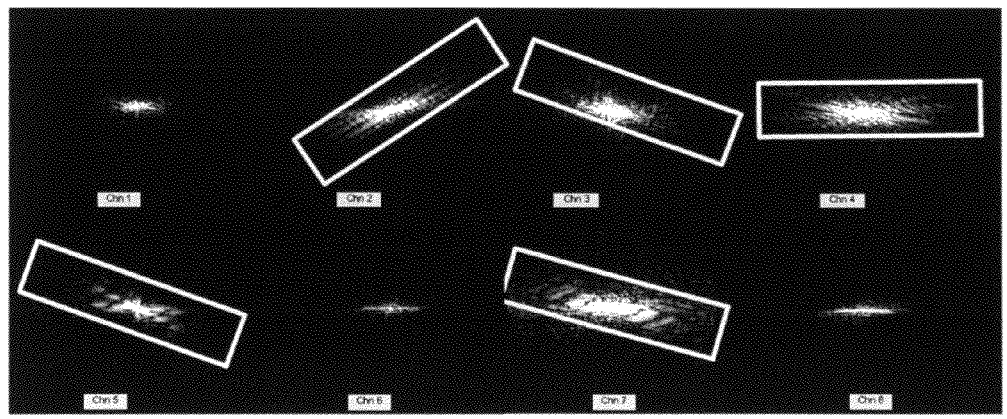
FIG. 4 shows the k-space signal sampled simultaneously by receiver channels 1 through 8.

FIG. 4 shows the k-space signal sampled simultaneously by receiver channels 1 through 8. The signal in channels 2, 3, 4, 5, and 7 are the highest, and a blade superimposed on each of these high signal channels shows the extent of data to be targeted in TACHO. For instance, in the case of multiple channels of signal acquisition, the five channels with the highest overall signal could be examined, and the acquisition blades adjusted to encompass the maximal signal region from each of the five receiver channels. Note that the blades of overlapping acquisition are positioned based on an initial distribution of image data, and are not positioned based on a change of data. The positioning may be done manually or, preferably, performed automatically by logic run on the scanner computer system, say to maximize the summed signal over each blade region, or to maximize the summed signal within the blade at some defined distance from the k-space center (to preferentially capture data "spurs" that extend into the outer regions of k-space).

Figure 5:
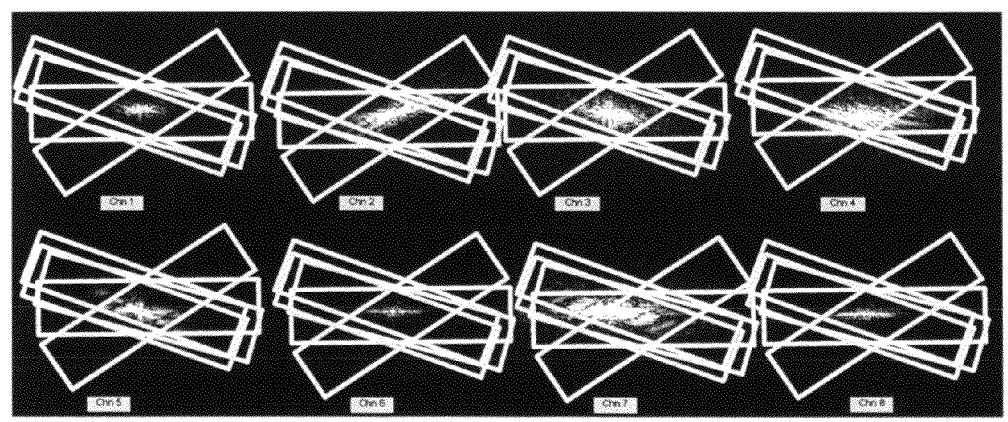
FIG. 5 shows for the individual targeted sampling regions shown in FIG. 4 the composite coverage of k-space is indicated.

Typically, the five overlapping blades of acquisition (in this example, applied to cardiovascular image data) will overlap to different degrees such that the central region of k-space is acquired in each blade, and selected outer regions may only be acquired once or twice, while some regions will not be acquired by any blade, FIG. 5. FIG. 5 shows for the individual targeted sampling regions shown in FIG. 4 the composite coverage of k-space is indicated. Note that coverage of outer regions in the composite acquisition encompasses the major regions of signal, while the central region is sampled multiple times. Preferably, the data from the separate blades are acquired such that the density requirements of k-space are satisfied for each blade separately: when the blade data are fitted to a regular rectilinear rectangular k-space grid, the signal is not aliased from any direction of the imaged object. Alternatively, the pattern and density of the multiple blades can be analyzed prior to completion of the acquisition, and the density of sampling k-space within each blade can be adjusted such that adequate density in k-space is only satisfied when data from all blades are combined. While it is convenient to consider the conditions for each blade as being acquired as parallel lines of k-space, this is not a necessary requirement for TACHO. Where the TACHO acquisitions overlap in k-space signal averaging can be performed. Since all data blades overlap near the center of k-space, the SNR of the central region is improved compared to a single acquisition scan. Also, by limiting the number of blades and the sampled data within each blade (typically controlled by blade width), the total acquisition time in TACHO need not extended beyond that of a comparable conventional rectilinear scan of k-space. Thus, by performing selective region averaging, the SNR of the resulting image(s) is increased over the conventional rectilinear scan while scan time is comparable. Further, compared to a PROPELLER based scan, the scan time is reduced in TACHO.

Another aspect of TACHO is that by using a series of lines to acquire each blade, the width of the blade is typically much lower than the width of k-space coverage required by a corresponding rectilinear scan (in the example given here the width of each blade is approximately ⅕ of that for a corresponding rectilinear scan). Thus, in scan situations where the preparation time for applying the phase encoding gradient becomes a limiting factor in reducing the scan repetition time (TR), TACHO has an advantage due to the reduced extent required for the phase encoding required (which need only be sufficient to span the width of the blade).

In cases where single oblique and double oblique scans are required, limitations are typically placed on the manner in which gradients can be applied due to the consideration of not exceeding a maximum slew rate (governed by FDA guidelines for human systems) and to avoid exceeding the physical driving power of the gradient amplifiers. Conventionally, gradients are restricted in strength to a factor of the square root of 3 lower than the maximal gradient. By limiting the maximal extent of phase encoding in TACHO, this restriction can be relaxed, since it is known that the maximal phase gradient applied will be lower than the maximal read gradient by a factor related to the TACHO k-space blade width.

Figure 6A:
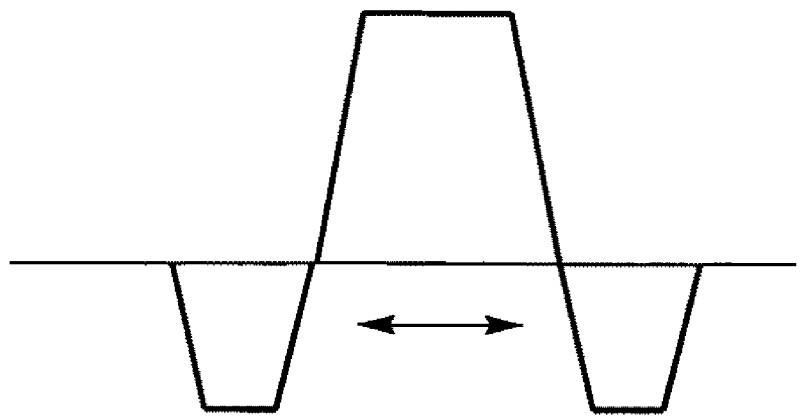
FIG. 6a indicates the widely used trapezoidal gradient waveform, where signal is only read out during the plateau of the trapezoid (indicated by the arrow).
Figure 6B:
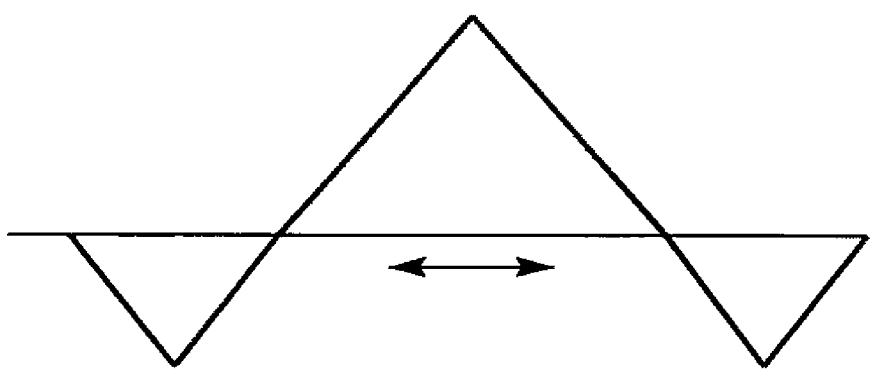
FIG. 6b shows the use of a linearly ramped gradient is applied with sampling occurring over the increasing and decreasing lobes of the gradient (indicated by the arrow).

When reading out the MRI 10 signal to form a line of k-space, it is typical to apply the read gradient as a trapezoidal shape, and only read signal during the plateau of the trapezoid, FIG. 6. Other approaches exist, such as spiral imaging, whereby non-trapezoidal and non-plateau gradients are applied to read out the k-space data. TACHO allows the read gradient to be applied in a flexible manner. For instance, a triangular gradient shape may be used, applied with the amplitude of the triangular gradient waveform exceeding the amplitude of the conventional trapezoidal gradient used in rectilinear signal read-out. In TACHO, excessive gradient slew rate can be avoided due to the limitations placed on the phase encoding gradient. By using a triangular shaped gradient waveform, the bandwidth of the received signal progressively increases as the gradient waveform increases. It can be arranged in TACHO for the low gradient waveform values of the triangular read out to acquire the outer regions of k-space, while the progressively higher gradient amplitude is applied to read the central region of k-space, FIGS. 6a and 6b. FIG. 6a indicates the widely used trapezoidal gradient waveform, where signal is only read out during the plateau of the trapezoid (indicated by the arrow). FIG. 6b shows the use of a linearly ramped gradient is applied with sampling occurring over the increasing and decreasing lobes of the gradient (indicated by the arrow). The advantage of this mode of signal readout is that the SNR of the outer regions of k-space are typically much lower than the central region, and thus benefit from the reduced bandwidth acquisition allowed in TACHO.

Typically, the bandwidth of the receiver electronics is set at a level sufficiently wide in Hertz to allow through the full bandwidth of signal. In the case of sampling the outer regions of k-space in a low gradient field, the bandwidth of the signal present is low, and in the situation of acquiring data with a fixed receiver wider bandwidth, the noise contamination from with wider bandwidth regions can be compensated for by sampling at a sufficiently high rate (given by the Nyquist criteria) such that the signal is sampled to represent the full receiver bandwidth or even higher (i.e. over sampling). However, in this example, the signal-rich center is acquired at a high bandwidth of signal, which reduces the SNR in this region of k-space. By boosting the SNR of the outer regions of k-space by acquiring low bandwidth data and by allowing multiple averages of the center of k-space in TACHO, due to the multiple overlapping regions of k-space, any SNR loss of the central region can be compensated for by the signal averaging aspect of TACHO, thus the overall SNR is improved by boosting the SNR of the outer regions of k-space and preserving the SNR in the center of k-space. It is possible to apply the triangular read-out gradient to the TACHO acquisition while maintaining the same overall TR as a conventional rectilinear (trapezoidal gradient) readout due to the higher amplitude of gradient allowed for the readout section. In TACHO, there is great freedom allowed to boost the SNR of whichever region of k-space will be most beneficial for the scan. For instance, it may be known that for a certain class of scan, boosting the SNR of the outer regions of k-space is more beneficial than boosting the SNR of the central region.

Each TACHO k-space line is acquired at a sampling rate such that no signal aliasing occurs. The sampling rate is given by the Nyquist criterion of at least two sample points per wavelength for the maximal frequency signal present. The separation in k-space ($\Delta K$) of adjacent points or lines is related to the field of view by the equation, Field of View=$2 \times \Pi / \Delta K$ Thus, lines that traverse k-space at an angle to the primary axes are more closely spaced than lines parallel to the primary axes. The worst-case scenario is for a set of lines at 45 degrees to the primary axes. In this case, lines are spaced closer by a factor of the inverse of the square root of 2. The multiple sets of k-space lines can be assembled or reconstructed in to an image in multiple ways. For illustrative purposes, here consider re-gridding the multiple sampled blades onto a regularized rectilinear set of points. Re-gridding can occur using data interpolation. Once re-gridding is accomplished, individual images can be generated by performing Fourier transformation of the data.

Figure 7A:
FIG. 7a shows one image from the original series of cardiovascular images.
Figure 7B:
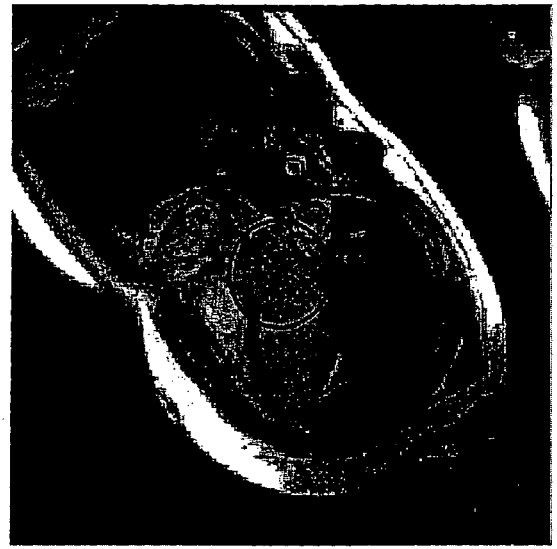
FIG. 7b shows the corresponding frame simulating the TACHO acquisition is shown in the right panel.

A simulation of TACHO was performed using data sets acquired using conventional rectilinear sampling of k-space. In this case, five similar data sets were acquired of the cardiovascular system and five TACHO acquisition blades were applied, each of width 50 lines. The original data series were acquired with a matrix resolution of 256×256 points. Thus, the simulated TACHO scan acquired a similar amount of data to one of the conventional rectilinear matrix scans (i.e. the simulated acquisition for the TACHO series was similar to each of the individually acquired series of images). Since each of the TACHO sets of lines (blade) are separately acquired, the acquisition was simulated by obtaining each TACHO blade from a separate image series. TACHO data were regridded on to the rectilinear matrix and where data overlapped, averaging was performed to normalize the data sets. Results in FIGS. 7a and 7b show that the TACHO image has approximately doubled the SNR compared to a representative original series image. FIG. 7a shows one image from the original series of cardiovascular images. FIG. 7b shows the corresponding frame simulating the TACHO acquisition is shown in FIG. 7a. The TACHO data was simulated using 5 series of images, while the simulated acquisition time was similar to that of the original scan of the left panel. Note the increase in SNR in the TACHO image compared to the original. This is apparent in the greater uniformity of blood in the heart chamber (circled).

Figure 8A:
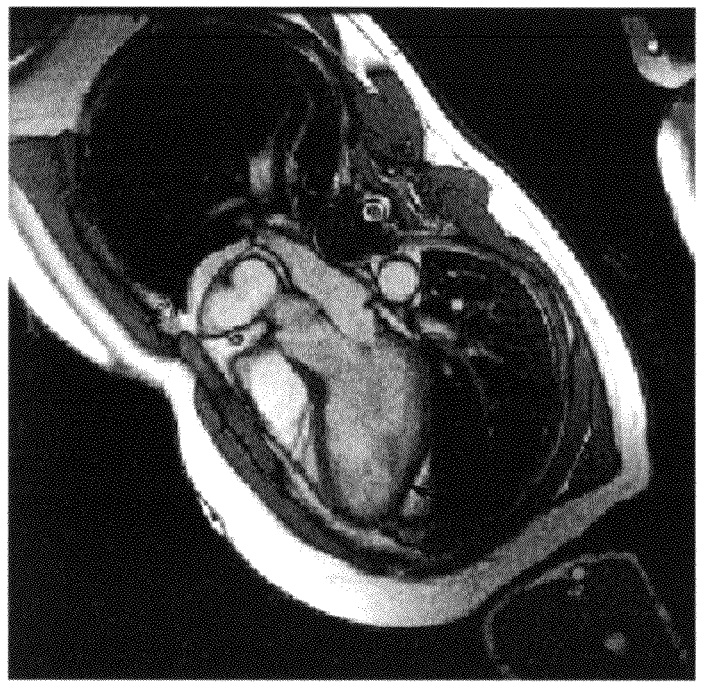
FIG. 8a shows one image from the original series of cardiovascular images.
Figure 8B:
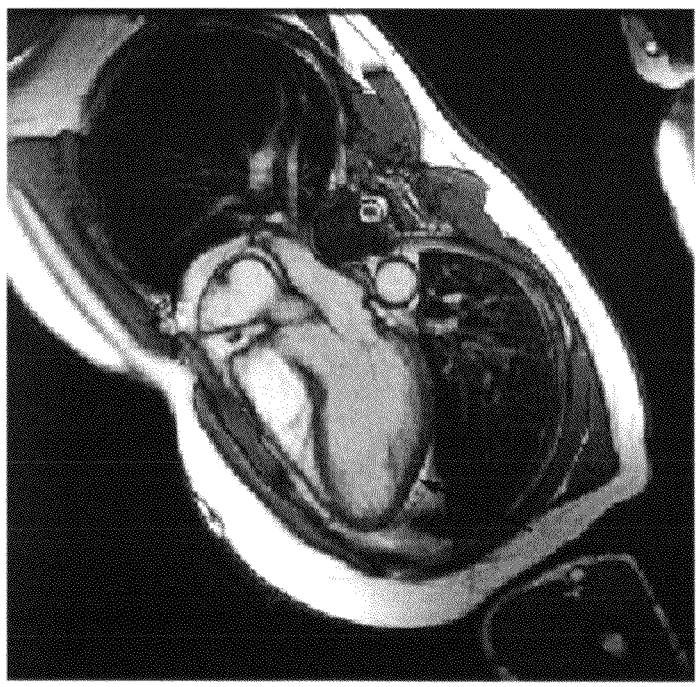

The SNR-rich TACHO data can be further improved by application of post signal processing. In the example given here additional signal processing was applied to substitute approximately static regions in the image domain with the average signal, then the image was transformed into the Fourier (k-space) domain and the approximately static regions in k-space were similarly averaged. In this case the decision of what constituted an approximately static region was to compare the standard deviation of the time series of corresponding points with the average of the time series. If the standard deviation was less than say, 30% of the average, then the data was regarded as being approximately static. The results of this additional noise suppression operation approximately further double the overall SNR in the cardiac region for the TACHO images, and achieved higher improvements in the static body regions, FIGS. 8a and 8b. FIG. 8a shows one image from the original series of cardiovascular images. FIG. 8b shows the corresponding frame simulating the TACHO acquisition is shown in FIG. 8a, in this instance additional post processing has been applied to the TACHO data to show the potential for further increases in SNR. Note the greater clarity of the thin pericardial membrane in the TACHO image compared to the original (arrowed). The higher SNR of the TACHO scan allows such signal processing approaches to work better due to the superior identification of static vs. dynamic signals, allowing retention of true dynamic features, while true static features are more aggressively averaged.

Figure 9:
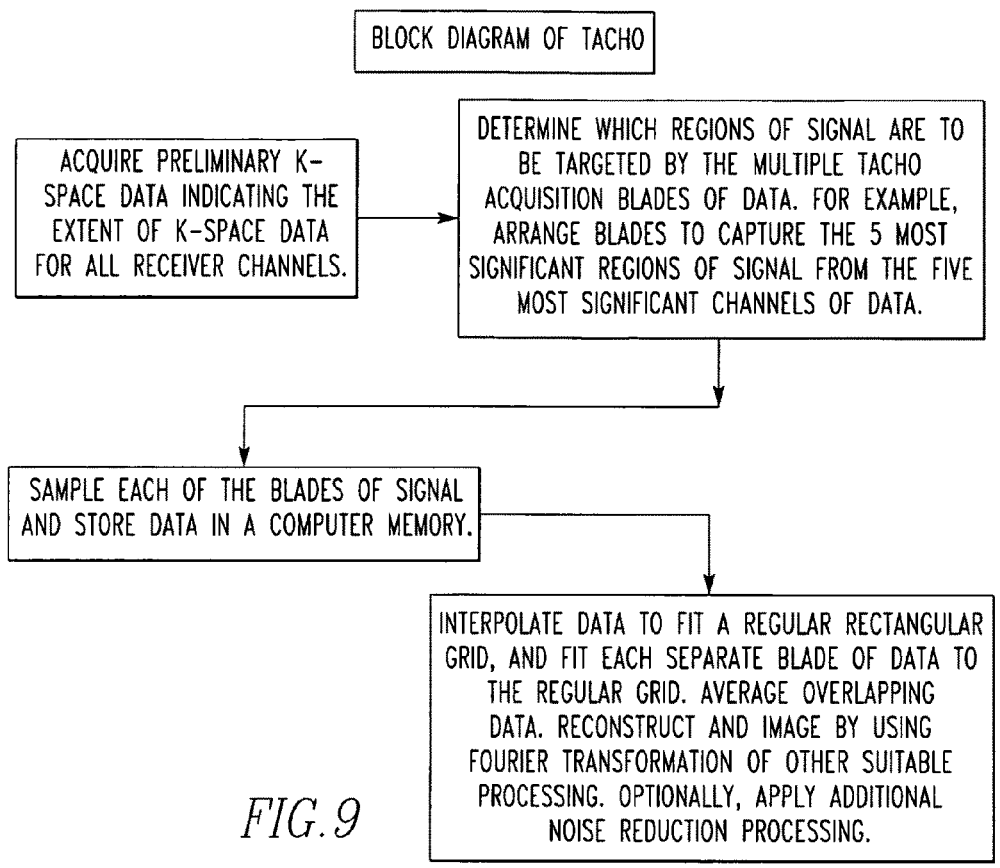
FIG. 9 is a flow chart with respect to the present invention.

FIG. 9 is a flow chart of TACHO.

FIG. 10 is a block diagram of the present invention.

The MRI 10 technique here impacts magnetic resonance imaging which is typically regarded as being limited by SNR. Typically, SNR can be improved by a variety of means, including signal averaging, use of increasing number of receiver channels, use of higher main magnetic field strengths. Each of these approaches has drawbacks and limitations, e.g. averaging increases scan time, higher numbers of receiver channels is limited by the depth of signal penetration into interior body regions, and higher magnetic fields result in increased power deposition in the body. The TACHO approach allows the benefits of signal averaging to be realized without extending the scan time beyond a conventional scan time, and without losing significant detail in images.

The PROPELLER scan provides images of superior SNR compared to comparable conventional scans. However, PROPELLER scan times are very long compared with comparable resolution conventional rectilinear scans. The TACHO scan, while incorporating a similar acquisition pattern to PROPELLER for each blade, applies each blade based on prior data, thus limiting the extent of k-space that has to be acquired while not significantly affecting image information.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

The invention claimed is:

1. An MRI comprising:
    imaging coils:
    receiving coils; and
    a controller in communication with the imaging coils and the receiving coils which controls the imaging coils and the receiving coils to sample k space associated with a patient in a pattern based on prior knowledge of k space data, and which reconstructs an image of the patient from the sampled k space,
    wherein the controller causes the coils to sample only a portion of k space based on the prior knowledge,
    wherein the controller uses the prior knowledge to obtain desired portions of the k space, and
    wherein the controller causes the imaging and receiving coils to form multiple channels of signal acquisition and the controller adjusts acquisition blades defined by the imaging and receiving coils to acquire desired signal from each of the channels based on the prior knowledge.

2. The MRI as described in claim 1 wherein the acquisition blades overlap.

3. The MRI as described in claim 2 wherein the acquisition blades overlap to different degrees.

4. The MRI as described in claim 3 wherein data from separate blades are acquired such that density requirements of k space are satisfied for each blade separately.

5. The MRI as described in claim 4 wherein the blades overlap near a center region of k space to improve a signal-to-noise ratio of the center region as compared to a single acquisition scan of the center region.

6. The MRI as described in claim 5 wherein the sample data within each blade is limited.

7. The MRI as described in claim 6 wherein phase encoding by the imaging coils is only sufficient to span no greater than a width of each blade.

8. The MRI as described in claim 7 wherein gradients are applied by the imaging coils which do not exceed a maximum predetermined slew rate.

9. The MRI as described in claim 8 wherein each k space line is acquired at a sampling rate such that no signal aliasing occurs.

10. The MRI as described in claim 9 wherein prior knowledge of k space is obtained from discarded k space data.

11. A method of an MRI comprising the steps of:
    acquiring preliminary k space data of a patient indicating the extent of k space data for all receiver channels using imaging and receiving coils;
    determining with a controller which regions of signal associated with the k space are to be targeted by multiple acquisition blades of data with the imaging and receiver coils based on the preliminary k space;
    sampling each of the regions determined by the controller with the blades to obtain k space data;
    storing the k space data in a memory;
    interpolating the k space data to fit in a regular rectangular grid and fitting each separate blade of:
    k space data to the grid with the controller;
    averaging overlapping k space data with the controller; and
    reconstructing an image from the k space data.

12. The method as described in claim 11 including the step of applying post acquisition data processing to further enhance a signal to noise ratio of the k-space data, making use of the higher signal to noise of the overlapping k space data.

13. The method as described in claim 12 including the step of the controller causing the coils to sample only a portion of k space based on the prior knowledge.

14. The method as described in claim 13 including the step of the controller using the prior knowledge to obtain desired portions of the k space.

15. The method as described in claim 14 including the step of the controller causing the imaging and receiving coils to form multiple channels of signal acquisition and adjusting acquisition blades defined by the imaging and receiving coils to acquire desired signal from each of the channels based on the prior knowledge.

16. A method of an MRI comprising the steps of:
    acquiring preliminary k space data of a beating heart of a patient indicating the extent of k space data for all receiver channels using imaging and receiving coils;
    determining with a controller which regions of signal associated with the k space are to be targeted by multiple acquisition blades of data with the imaging and receiver coils based on the preliminary k space;
    sampling each of the regions determined by the controller with the blades to obtain k space data;
    storing the k space data in a memory;
    interpolating the k space data to fit in a regular rectangular grid and fitting each separate blade of:
    k space data to the grid with the controller;
    averaging overlapping k space data with the controller; and
    reconstructing an image from the k space data.

17. An MRI comprising:
    means for acquiring signals from a patient;
    imaging coils;
    receiving coils; and
    means for controlling the acquiring means in communication with the acquiring means, the imaging coils and the receiving coils and configured to:
        control the acquiring means to sample k space associated with the patient in a pattern based on prior knowledge of k space data,
        reconstruct an image of the patient from the sampled k space,
        cause the coils to sample only a portion of k space based on the prior knowledge,
        use the prior knowledge to obtain desired portions of the k space,
        cause the imaging and receiving coils to form multiple channels of signal acquisition, and adjust acquisition blades defined by the imaging and receiving coils to acquire desired signal from each of the channels based on the prior knowledge.

18. A computer program stored on a non-transitory computer readable medium for an MRI comprising the computer generated steps of:

acquiring preliminary k space data of a patient indicating the extent of k space data for all receiver channels using imaging and receiving coils operably connected to the non-transitory computer readable medium;

determining with a controller operably connected to the non-transitory computer readable medium which regions of signal associated with the k space are to be targeted by multiple acquisition blades of data with the imaging and receiver coils based on the preliminary k space;

sampling each of the regions determined by the controller with the blades to obtain k space data;

storing the k space data in a memory;

interpolating the k space data to fit in a regular rectangular grid and fitting each separate blade of:

k space data to the grid with the controller;

averaging overlapping k space data with the controller; and reconstructing an image from the k space data.

* * * * *